(12) United States Patent
Ranganathan et al.

(10) Patent No.: US 11,742,055 B2
(45) Date of Patent: Aug. 29, 2023

(54) CARRIER BASED HIGH VOLUME SYSTEM LEVEL TESTING OF DEVICES WITH POP STRUCTURES

(71) Applicant: Advantest Test Solutions, Inc., San Jose, CA (US)

(72) Inventors: Karthik Ranganathan, Foothill Ranch, CA (US); Gregory Cruzan, Anaheim, CA (US); Samer Kabbani, Laguna Niguel, CA (US); Gilberto Oseguera, Corona, CA (US); Ira Leventhal, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 0 days.

(21) Appl. No.: 17/984,127

(22) Filed: Nov. 9, 2022

(65) Prior Publication Data

US 2023/0062440 A1    Mar. 2, 2023

Related U.S. Application Data

(62) Division of application No. 17/531,486, filed on Nov. 19, 2021, now Pat. No. 11,587,640.

(Continued)

(51) Int. Cl.
*G11C 29/56*  (2006.01)
*G01R 31/28*  (2006.01)
*G01R 31/319*  (2006.01)

(52) U.S. Cl.
CPC .... *G11C 29/56016* (2013.01); *G01R 31/2863* (2013.01); *G01R 31/2867* (2013.01);

(Continued)

(58) Field of Classification Search
None
See application file for complete search history.

(56) References Cited

U.S. PATENT DOCUMENTS 5,126,656 A    6/1992   Jones
5,164,661 A    11/1992  Jones
(Continued)

FOREIGN PATENT DOCUMENTS

CN    101073016       11/2007
CN    101073016 A     11/2007
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Jermele M Hollington

(57) ABSTRACT

A testing apparatus comprises a tester comprising a plurality of racks, wherein each rack comprises a plurality of slots, wherein each slot comprises: (a) an interface board affixed in a slot of a rack, wherein the interface board comprises test circuitry and a plurality of sockets, each socket operable to receive a device under test (DUT); and (b) a carrier comprising an array of DUTs, wherein the carrier is operable to displace into the slot of the rack; and (c) an array of POP memory devices, wherein each POP memory device is disposed adjacent to a respective DUT in the array of DUTs. Further, the testing apparatus comprises a pick-and-place mechanism for loading the array of DUTs into the carrier and an elevator for transporting the carrier to the slot of the rack.

20 Claims, 10 Drawing Sheets

Related U.S. Application Data

(60) Provisional application No. 63/158,082, filed on Mar. 8, 2021.

(52) U.S. Cl.
CPC ............... *G01R 31/31905* (2013.01); *G11C 2029/5602* (2013.01)

(56) References Cited

U.S. PATENT DOCUMENTS

| | | | |
|---|---|---|---|
| 5,239,093 A | 8/1993 | Cheng | |
| 5,315,240 A | 5/1994 | Jones | |
| 5,329,093 A | 7/1994 | Okano | |
| 5,420,521 A | 5/1995 | Jones | |
| 5,738,531 A | 4/1998 | Beaman et al. | |
| 5,821,505 A | 10/1998 | Tustaniwskyj et al. | |
| 5,909,657 A | 6/1999 | Onishi et al. | |
| 6,184,504 B1 | 2/2001 | Cardella | |
| 6,359,264 B1 | 3/2002 | Schaper et al. | |
| 6,389,225 B1 | 5/2002 | Malinoski et al. | |
| 6,452,113 B2 | 9/2002 | Dibene et al. | |
| 6,498,899 B2 | 12/2002 | Malinoski et al. | |
| 6,515,470 B2 | 2/2003 | Suzuki et al. | |
| 6,668,570 B2 | 12/2003 | Wall et al. | |
| 6,711,904 B1 | 3/2004 | Law et al. | |
| 6,825,681 B2 | 11/2004 | Feder et al. | |
| 6,862,405 B2 | 3/2005 | Malinoski et al. | |
| 6,985,000 B2 | 1/2006 | Feder et al. | |
| 7,042,240 B2 | 5/2006 | Lopez et al. | |
| 7,126,217 B2 | 10/2006 | Chiu et al. | |
| 7,138,811 B1 | 11/2006 | Mahoney et al. | |
| 7,151,388 B2 | 12/2006 | Gopal et al. | |
| 7,311,782 B2 | 12/2007 | Strang et al. | |
| 7,355,428 B2 | 4/2008 | Kabbani et al. | |
| 7,411,792 B2 | 8/2008 | Richards et al. | |
| 7,436,059 B1 | 10/2008 | Ouyang | |
| 7,519,880 B1 | 4/2009 | Johnson et al. | |
| 7,626,407 B2 | 12/2009 | Kabbani | |
| 7,646,596 B2 | 1/2010 | Ng | |
| 7,659,738 B2 | 2/2010 | Hong | |
| 7,726,145 B2 | 6/2010 | Nakamura | |
| 7,755,899 B2 | 7/2010 | Stenmark | |
| 7,781,883 B2 | 8/2010 | Sri-Jayantha et al. | |
| 7,830,164 B2 | 11/2010 | Earle et al. | |
| 7,848,106 B2 | 12/2010 | Merrow | |
| 7,929,303 B1 | 4/2011 | Merrow | |
| 8,343,280 B2 | 1/2013 | Iimuro | |
| 8,558,540 B2 | 10/2013 | Wu et al. | |
| 8,772,682 B2 | 7/2014 | Ambal et al. | |
| 8,927,907 B2 | 1/2015 | Fink et al. | |
| 8,970,244 B2 | 3/2015 | Di Stefano et al. | |
| 9,080,820 B2 | 7/2015 | Bolton | |
| 9,291,667 B2 | 3/2016 | Armstrong et al. | |
| 9,307,578 B2 | 4/2016 | Pease | |
| 9,310,145 B2 | 4/2016 | Colongo et al. | |
| 9,414,526 B2 | 8/2016 | Mann et al. | |
| 9,494,353 B2 | 11/2016 | Yu et al. | |
| 9,594,113 B2 | 3/2017 | Davis et al. | |
| 9,766,287 B2 | 9/2017 | Naraski et al. | |
| 9,841,772 B2 | 12/2017 | Bucher | |
| 10,056,225 B2 | 8/2018 | Gaff et al. | |
| 10,126,356 B2 | 11/2018 | Barabi et al. | |
| 10,163,668 B2 | 12/2018 | Steinhauser | |
| 10,354,785 B2 | 7/2019 | Yamaguchi et al. | |
| 10,656,200 B2 | 5/2020 | Cruzan et al. | |
| 10,775,408 B2 | 9/2020 | Carvalho et al. | |
| 10,908,207 B2 | 2/2021 | Barabi et al. | |
| 10,955,466 B2 | 3/2021 | Tsai et al. | |
| 10,983,145 B2 | 4/2021 | Akers et al. | |
| 11,143,697 B2* | 10/2021 | Wolff | G01R 31/2834 |
| 11,493,551 B2 | 11/2022 | Ranganathan et al. | |
| 2002/0026258 A1 | 2/2002 | Suzuki et al. | |
| 2002/0118032 A1 | 8/2002 | Norris et al. | |
| 2003/0155939 A1 | 8/2003 | Lutz et al. | |
| 2004/0017185 A1 | 1/2004 | Song et al. | |
| 2005/0026476 A1 | 2/2005 | Mok et al. | |
| 2005/0086948 A1 | 4/2005 | Milke-Rojo et al. | |
| 2005/0103034 A1 | 5/2005 | Hamilton et al. | |
| 2005/0151553 A1 | 7/2005 | Kabbani et al. | |
| 2005/0169733 A1 | 8/2005 | Drynkin et al. | |
| 2006/0158207 A1 | 7/2006 | Reitinger | |
| 2006/0290370 A1 | 12/2006 | Lopez | |
| 2009/0160472 A1 | 6/2009 | Segawa et al. | |
| 2009/0218087 A1 | 9/2009 | Oshima | |
| 2010/0042355 A1 | 2/2010 | Aube et al. | |
| 2011/0050268 A1 | 3/2011 | Co et al. | |
| 2011/0074080 A1 | 3/2011 | Di Stefano et al. | |
| 2013/0181576 A1 | 7/2013 | Shiowaza et al. | |
| 2013/0285686 A1 | 10/2013 | Malik et al. | |
| 2014/0035715 A1 | 2/2014 | Takahashi et al. | |
| 2014/0251214 A1 | 9/2014 | Cuvalci et al. | |
| 2015/0028912 A1 | 1/2015 | Cho et al. | |
| 2015/0137842 A1 | 5/2015 | Murakami et al. | |
| 2015/0168450 A1 | 6/2015 | Wooden et al. | |
| 2015/0226794 A1 | 8/2015 | Chen | |
| 2016/0084880 A1 | 3/2016 | Locicero et al. | |
| 2016/0247552 A1 | 8/2016 | Kim et al. | |
| 2016/0351526 A1 | 12/2016 | Boyd et al. | |
| 2017/0059635 A1* | 3/2017 | Orchanian | G01R 1/0458 |
| 2017/0102409 A1 | 4/2017 | Sarhad et al. | |
| 2018/0024188 A1 | 1/2018 | Cruzan et al. | |
| 2018/0189159 A1 | 7/2018 | Carmichael et al. | |
| 2018/0218926 A1 | 8/2018 | Stuckey et al. | |
| 2019/0064254 A1 | 2/2019 | Bowyer et al. | |
| 2019/0064261 A1* | 2/2019 | Bowyer | G01R 31/2893 |
| 2019/0162777 A1 | 5/2019 | Chiang et al. | |
| 2019/0271719 A1 | 9/2019 | Sterzbach | |
| 2019/0310314 A1 | 10/2019 | Liu et al. | |
| 2019/0346482 A1 | 11/2019 | Kiyokawa et al. | |
| 2020/0041564 A1 | 2/2020 | Cojocneanu | |
| 2020/0363104 A1 | 11/2020 | Macdonald et al. | |
| 2020/0371155 A1 | 11/2020 | Walczyk et al. | |
| 2021/0071917 A1 | 3/2021 | Pei et al. | |
| 2021/0183668 A1 | 6/2021 | Cagle et al. | |
| 2021/0293495 A1 | 9/2021 | Barako et al. | |
| 2021/0396801 A1 | 12/2021 | Ranganathan et al. | |
| 2022/0044084 A1 | 2/2022 | Cardy | |
| 2022/0082587 A1 | 3/2022 | Gopal et al. | |
| 2022/0128597 A1 | 4/2022 | McKenna et al. | |
| 2022/0128599 A1* | 4/2022 | Campbell | G01R 31/2863 |
| 2022/0137092 A1 | 5/2022 | Ranganathan et al. | |
| 2022/0137129 A1 | 5/2022 | Ranganathan et al. | |
| 2022/0206061 A1 | 6/2022 | Ranganathan et al. | |
| 2022/0284982 A1* | 9/2022 | Ranganathan | G01R 31/31905 |

FOREIGN PATENT DOCUMENTS

| | | |
|---|---|---|
| CN | 103038751 | 4/2013 |
| CN | 103038751 A | 4/2013 |
| CN | 105144114 A | 12/2015 |
| CN | 109716513 | 5/2019 |
| CN | 110214270 | 9/2019 |
| CN | 110618903 A | 12/2019 |
| EP | 3270261 A1 | 1/2018 |
| JP | 2005156172 A | 6/2005 |
| JP | 2008275512 A | 11/2008 |
| TW | 446682 | 7/2001 |
| TW | 446682 B | 7/2001 |
| TW | 200535440 A | 11/2005 |
| TW | 200620596 | 6/2006 |
| TW | 200620596 A | 6/2006 |
| TW | 200628818 | 8/2006 |
| TW | 200628818 A | 8/2006 |
| TW | 201226579 | 7/2012 |
| TW | 201226579 A | 7/2012 |
| TW | 201229535 | 7/2012 |
| TW | 201229535 A | 7/2012 |
| TW | 201323883 | 6/2013 |
| TW | 201333497 A | 8/2013 |
| TW | 201447325 | 12/2014 |
| TW | 201504647 A | 2/2015 |
| TW | 201608254 | 3/2016 |
| TW | 201608254 A | 3/2016 |
| TW | 201636618 A | 10/2016 |

(56) References Cited

FOREIGN PATENT DOCUMENTS

| TW | 201712459 | | 4/2017 |
|----|-----------|---|--------|
| TW | 201712459 | A | 4/2017 |
| TW | 201834134 | | 9/2018 |
| TW | 201834134 | A | 9/2018 |
| TW | 201840996 | A | 11/2018 |
| TW | 651540 | B | 2/2019 |
| TW | 202004980 | | 1/2020 |
| TW | 202004980 | A | 1/2020 |
| TW | 202043787 | | 12/2020 |
| TW | 202043787 | A | 12/2020 |
| WO | 2016122039 | A1 | 8/2016 |
| WO | 201712076 | A1 | 1/2017 |
| WO | 2017015052 | A1 | 1/2017 |
| WO | 2017039936 | A1 | 3/2017 |
| WO | 2020159954 | A1 | 8/2020 |

\* cited by examiner

CARRIER BASED HIGH VOLUME SYSTEM LEVEL TESTING OF DEVICES WITH POP STRUCTURES

CROSS-REFERENCE TO RELATED APPLICATIONS

This application is a divisional of and claims priority to co-pending U.S. patent application Ser. No. 17/531,486, filed on Nov. 19, 2021, entitled "Carrier Based High Volume System Level Testing of Devices with POP Structures," and which application also claims priority to U.S. Provisional Application 63/158,082 entitled "Carrier Based High Volume System Level Testing of Devices with Pop Structures," filed on Mar. 8, 2021. The entire contents of the above-listed applications are also hereby incorporated by reference for all purposes as if fully set forth herein.

FIELD OF THE INVENTION

The present disclosure relates generally to the field of automated test equipment and more specifically to techniques for massively parallel high-volume testing of devices under test.

BACKGROUND OF THE INVENTION

Automated test equipment (ATE) includes any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer. ATE systems can also be used to test and record device performance for pass/fail and for device binning determinations.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure. Other ATE systems can categorize a performance of a device for binning purposes.

There are several different types of ATE systems currently existing in the marketplace. One of them involves transporting devices under test (DUTs) on Tester Interface Boards (TIBs) that include sockets and active test circuitry. The advantage of transporting DUTs using TIBs is that a separate apparatus for device transport is not required. The TIB is used for both testing and transport. Further, the alignment of the DUTs can be performed at a central alignment station. This is particularly useful where vision alignment for finer pitches is required. Also, blind-mate connectors for TIBs allow quick replacement for servicing. ATE systems using TIBs have several drawbacks. For example, the high-frequency signal path between the socket (per DUT) test circuitry and the equipment in a test rack is repeatedly disconnected during normal test operation, making maintenance of signal fidelity and high-speed signal path calibration difficult. Further, there is an increased cost (both an initial set-up cost and maintenance costs) for high cycle count high-frequency connectors between a TIB and a test rack.

Another type of ATE system involves inserting DUTs directly into sockets on stationary test boards with pick-and-place assemblies. In this solution, a single centralized pick-and-place assembly is used to transfer the DUTs between JEDEC trays and test sockets on fixed-location test boards. This type of ATE system has its advantages also. For example, this type of ATE system does not require additional mechanical electronics other than the pick-and-place assembly. Further, shielding and other top-side contact solutions are easy to implement due to available space. Nevertheless, this type of ATE systems also has its drawbacks. For example, parallelism and Units Per Hour (UPH) (units tested per hour) is severely limited so this type of ATE system is unsuitable for high-volume manufacturing (HV) applications. Further, there is a low utilization of the expensive pick-and-place apparatus, which often sits idle when the test time is long.

A different type of ATE system transports DUTs to test slots (or stations) on JEDEC trays and loads them into test slots with per-slot pick-and-place assemblies. In this solution, each test slot or station has its own dedicated pick-and-place assembly which transfers the DUTs between the JEDEC trays or carriers and fixed-location test boards. The trays are transported between a central loading/unloading station and the test slots using a mechanical robotic system that can be implemented with elevators/conveyors or a robotic arm. Again, there are drawbacks associated with this type of system. For example, the per-slot pick and place assemblies increase system cost. Further, there is a low utilization of per-slot pick-and-place assemblies, which often sit idle when test time is long. These types of ATE systems may also potentially be unreliable due to multiple pick-and-place assemblies.

Finally, the classic memory tester and handle type of conventional ATE system also has many associated drawbacks. In this solution, the handler uses a pick-and-place mechanism to load DUTs from JEDEC trays into multi-DUT carriers that are moved to the testing chamber. The DUTs remain in the carrier while being simultaneously plunged into sockets which provide the electrical connection with the test equipment in the test system. The disadvantage with this system is that memory testers and handlers specifically work only with memory and do not incorporate shields for RF or any type of top-side contact. Further, space requirements for System Level Test (SLT) test circuitry and lack of any vertically-stacked slot architecture limit parallelism.

BRIEF SUMMARY OF THE INVENTION

Accordingly, there is a need for an ATE system that addresses the drawbacks associated with conventional ATE tester systems. Embodiments of the present invention provide a massively parallel high-volume test capability in a slot-based architecture, using multi-device passive carriers to transport the semiconductor devices from the loading/unloading station to the test slots. This eliminates the requirement to move the test sockets and/or test circuitry with the devices, which is the method used in the current state-of-the-art high-volume slot-based test systems. Eliminating this requirement simplifies the design of the system and provides improved performance (especially for RF and other high frequency applications), improved reliability, and reduced cost.

In one embodiment, the slot-based tester system comprises: a) a tester (including power delivery board and controls); b) a tester board such as ATE load-board, or Test Interface Board (TIB) comprising a plurality of Socket Interface Boards (SIB), or Burn-In Board (BIB) comprising a plurality of DUT Interface boards (DIB); c) an open socket to hold one or more DUTs (Device tinder Test); d) a passive carrier/test tray that holds multiple DUTs (note that multiple carriers or test trays may be present in the system); e) an optional parallel cover assembly system (DCA) to place socket covers (or optional RF shields) on top of DUTs in the carrier; f) a handler and movement system similar to a memory test handler that places DUTs into carriers and further places the DUTs within the carriers on top of the sockets; and g) plungers to push down the socket covers (and/or the optional RF shields) and DUTs into the sockets.

Further, along with the need for a slot-based architecture, there is a need to provide integrated device manufacturers, fabless semiconductor manufacturers and outsourced semiconductor assembly and test companies engaged in the high-volume manufacturing and testing of devices, a way to be able to use POP (package on package) structures during system level tests of their devices. For example, a customer manufacturing application processors will need to temporarily add memory (e.g., in a POP structure) to the application processors during system level tests of the processors. For testing purposes, customers need a convenient way to temporarily position the memory adjacent to the processors. Accordingly, a need exists for a slot-based architecture that can use POP structures to be able to perform system level tests of the devices.

In one embodiment, the slot-based tester system comprises: a) a tester (including power delivery board and controls); b) a tester board such as ATE load-board, or Test Interface Board (TIB) comprising a plurality of Socket Interface Boards (SIB), or Burn-In Board (BIB) comprising a plurality of DUT Interface boards (DIB); c) an open socket to hold one or more DUTs (Device Under Test); d) a passive carrier/test tray that holds multiple DUTs (note that multiple carriers or test trays may be present in the system); e) an optional parallel cover assembly system (PCA) to place POP memory nests on top of the DUTs in the carrier (where each DUT receives its own POP memory nest); f) a handler and movement system similar to a memory test handler that places DUTs into carriers and further places the DUTs within the carriers on top of the sockets, where the socket contains alignment features to guide the POP memory nest into the socket (e.g., typically there is a gross alignment pin and a fine alignment pin); and g) plungers to push down the socket covers (with optional POP memory nests) and DUTs into the sockets.

A POP memory nest comprises a structure that enables temporary electrical contact of a memory chip with a DUT (Device Under Test) in a vertically stacked POP (Package-on-Package) configuration. The structure may also provide a thermal conductivity path from a thermal head through the memory to the DUT. The POP memory nest is typically composed of a memory chip, an interposer layer that provides electrical conductivity between the contacts on the memory chip and the DUT while protecting the memory chip from damage during repeated contacting cycles, and a frame structure that houses the memory chip and interposer layer and has features for precise alignment with the socket containing the DUT during testing. While the structure typically interfaces a memory device with a processor device, it may also be a different nest that has an RF device stacked on top of a digital device.

In one embodiment, an apparatus comprises a tester comprising a plurality of racks, wherein each rack comprises a plurality of slots, wherein each slot comprises: a) an interface board affixed in a slot of a rack, wherein the interface board comprises test circuitry and a plurality of sockets, each socket of the plurality of sockets operable to receive a device under test (DUT); b) a carrier comprising an array of DUTs, wherein the carrier is operable to position into the slot of the rack, and wherein each DUT in the array of DUTs aligns with a respective socket of the plurality of sockets on the interface board; and c) an array of POP memory devices, wherein each POP memory device is disposed adjacent to a respective DUT in the array of DUTs. The apparatus also comprises a pick-and-place mechanism for loading the array of DUTs into the carrier and an elevator for transporting the carrier to the slot of the rack.

In another embodiment, the present invention pertains to a method of testing devices under test (DUTs), the method comprising: loading an array of DUTs on a carrier; displacing the carrier to a slot of a rack associated with a tester using an elevator, wherein the tester comprises a plurality of racks, wherein each rack of the plurality of racks comprises a plurality of slots; inserting the carrier into the slot of the rack; affixing an interface board in the slot of the rack, wherein the interface board comprises a plurality of sockets, and wherein each socket of the plurality of sockets is operable to receive a respective device under test (DUT), and wherein each DUT in the array of DUTs aligns with a respective socket of the plurality of sockets on the interface board; positioning a package-on-package (POP) memory array adjacent to the array of DUTs, wherein the POP memory array comprises an array of memory devices, wherein each memory device of the array of memory devices corresponds to a DUT in the array of DUTs; and actuating a socket cover of a plurality of socket covers onto each respective memory device in the POP memory array, and corresponding DUT, to make physical and electrical contact with each respective socket of the plurality of sockets.

Embodiments further include the above method and wherein each DUT of the array of DUTs comprises pads disposed on a top surface thereof and operable to make contact with a respective POP memory device and wherein said positioning comprises placing the array of memory devices into position using a parallel cover assembly system. Embodiments also include the above method and wherein the elevator comprises a dual-slot elevator comprising first and second slots, wherein the first slot is operable to transport the carrier to the slot of the rack, and wherein the second slot is operable to transport a transport a different carrier previously loaded into the slot of the rack. Embodiments include the above method and wherein the actuating is performed by a plurality of plungers, and wherein the plurality of socket covers and the POP memory array are integrated within the plurality of plungers. Embodiments include the above method and wherein said loading is performed using a handler and transport system and further comprising testing said array of DUTs and said array of memory devices, in combination, using said tester.

Using the beneficial aspects of the systems described, without their respective limitations, embodiments of the present invention provide a novel solution to address the drawbacks mentioned above.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
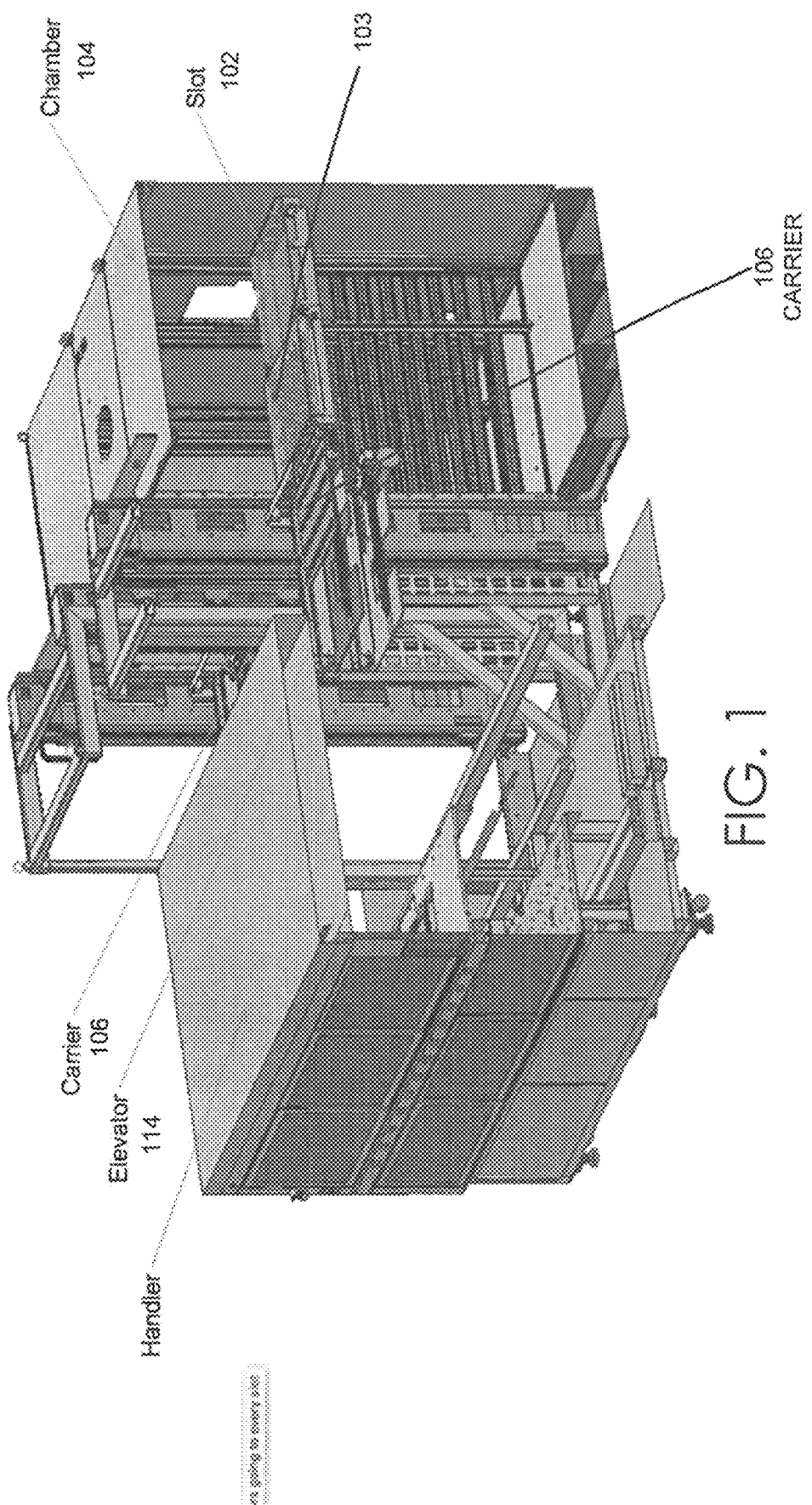
FIG. 1 illustrates a perspective view of a tester system that combines a carrier-based DUT delivery mechanism with a slot-based test architecture in accordance with embodiments of the present invention.

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "testing," "affixing," "coupling," "inserting," "actuating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Passive Carrier-Based Device Delivery for Slot-Based High-Volume Semiconductor Test System As noted above, there are several different types of ATE systems currently existing in the marketplace, each with their own set of strengths and weaknesses. In many systems, the high-frequency signal path between the socket test circuitry and the test equipment in the test rack is repeatedly disconnected during normal test operation, making maintenance of signal fidelity and high-speed signal path calibration difficult. Other types of ATE systems are unsuitable for high-volume manufacturing applications because the parallelism in these ATE systems is severely limited. In yet other ATE systems, low utilization of the expensive components of the test system, e.g., the pick-and-place assemblies is problematic.

Embodiments of the present invention address the drawbacks of conventional ATE systems by providing a massively parallel high-volume test capability in a slot-based architecture, using multi-device passive carriers to transport the semiconductor devices from the loading/unloading station to the test slots. This eliminates the requirement to move the test sockets and/or test circuitry with the devices. Eliminating this requirement simplifies the design of the system and provides improved performance (especially for RF and other high frequency applications), improved reliability, and reduced cost.

In accordance with embodiments of the present invention, a slot-based tester system comprises: a) a tester (including power delivery board and controls); b) a tester board such as ATE load-board, or Test Interface Board (TIB) comprising a plurality of Socket Interface Boards (SIB), or Burn-In Board (BIB) comprising a plurality of DUT Interface boards (DIB); c) an open socket to hold one or more DUTs (Device Under Test); d) a passive carrier/test tray that holds multiple DUTs (note that multiple carriers or test trays may be present in the system); e) an optional parallel cover assembly system (PCA) to place socket covers (or optional RF shields) on top of DUTs in the carrier; f) a handler and movement system similar to a memory test handler that places DUTs into carriers and further places the DUTs within the carders on top of the sockets; and g) plungers to push down the socket covers (and/or the optional RF shields) and DUTs into the sockets.

The typical users of the tester system disclosed herein would be: Integrated Device Manufacturers, Fabless Semiconductor Manufacturers, and Outsourced Semiconductor Assembly and Test companies engaged in the high-volume manufacturing and test of devices that operate in frequency ranges requiring careful maintenance of signal fidelity between test equipment and DUTs and electrical shielding to reduce interference between individual DUTs during testing. An example DUT would be an RF module used in a mobile phone for communications with a cell tower. Embodiments of the present invention are integral to handling and interfacing solutions included as part of an ATE (Automated Test Equipment) or SLT (System-level Test) system.

Embodiments of the present invention combine a carder-based DUT delivery mechanism with a slot-based high volume semiconductor test system architecture. FIG. 1 illustrates a perspective view of a. tester system that combines a carrier-based DUT delivery mechanism with a slot-based test architecture in accordance with embodiments of the present invention. The tester system comprises a chamber 104 with multiple racks (e.g., a left and a right rack) with a plurality of slots (e.g., slot 102 in the right rack and slot 103 in the left rack) that can be stacked vertically. Stacking the slots vertically allows more DUTs to be tested in parallel. For example, the chamber 104 can comprise upwards of 30 slots. In a different embodiment, the slots within the tester may be arranged horizontally rather than vertically.

As mentioned previously, the tester system combines the carrier-based device delivery mechanism with the slot-based architecture. The tester system comprises a pick-and-place mechanism (e.g., incorporated within handler 128) that loads the carrier(s) 106 and also further comprises an elevator system 114 that moves the carrier vertically to a particular desired spot. The advantage of using the passive carrier or test tray is that all the test electronic circuitry can remain in place in the test rack while the carrier can be moved into and out of the tester. As a result, the TIBs and/or SIBs advantageously do not need to be disconnected from the tester system. This has advantages for high-speed applications where the tester needs to maintain a stable and high accuracy signal path.

Conventional tester systems by comparison had to connect and disconnect test electronics with the sockets any time new DUTs had to be inserted into the test racks. This would not be ideal for high speed signal paths which require robust connectivity, repeatability and accuracy of signals. Embodiments of the present invention advantageously leave the test circuitry in place during testing. This has advantages for high speed signal paths and provides reliable connectivity, repeatability and accuracy of signals.

The high-parallelism architecture provided by embodiments of the present invention is advantageous because the test sockets and test circuitry remain in place in a fixed location with continuous connections to test instrumentation and supporting resources during normal test operations. An example application is an RF or other high-frequency test. In order to maintain signal fidelity over repeated insertions of the DUTs, the TIBs (Tester Interface Boards) with the sockets and corresponding per-DUT test circuitry remain fixed in the test rack of the system, and are only removed and disconnected for servicing. Since high-frequency testing requires specialized and costly instrumentation, it is not technically or financially feasible to build this equipment into the TIB, so the high-frequency signals pass through connectors between the TIB and the test equipment in the test rack. Accordingly, it is important that the connectors not be displaced each time a new set of DUTs need to be tested.

In conventional high-parallelism SLT systems, the TIBs move back-and-forth between the pick-and-place assembly for loading/unloading of the DUTs and the test rack for testing, requiring repeated disconnecting/reconnecting of the signal paths between the test rack and the DUTs. In other words, the TIB would need to be regularly disconnected and pulled out of the slots in order to load new batches of DUTs.

In the tester assembly of the present invention, the TIB does not need to be removed in and out of the slot. It remains in place connected and does not need to be disconnected to load a fresh batch of DUTs. With the TIBs remaining fixed in the test rack in accordance with embodiments of the present invention, the tester system uses a passive carrier or test tray 106 (shown in FIG. 1A) to move the DUTs between the pick-and-place assembly and the test rack. This maintains high-parallelism and high UPH (units per hour) without requiring repeated disconnects of the signal paths. During testing, the entire passive carrier 106 with multiple DUTs is inserted into a slot in the test rack, and lowered onto the fixed TIB. The DUTs remain in the carrier while per-DUT socket covers in the test rack are applied to provide the necessary force between the DUT and socket to complete the electrical connections, it should be noted that fixing the TIBs in the rack also provides additional flexibility to add external equipment and wire into the test rack.

In one embodiment, the socket covers may be part of a parallel socket cover assembly system that places socket covers on all the DUTs in the carrier before a plunger is used to actuate the DUTs. Actuating the DUTs means to apply contact force on top of the DUTs to push them down to make electrical contact with the socket electronics. In other words, the socket covers are placed on the DUTs by the parallel cover assembly system. The parallel cover assembly system may be similar to the one described in U.S. patent application Ser. No. 16/986,037, entitled, "Integrated Test Cell Using Active Thermal Interposer (ATI) with Parallel Socket Actuation," filed in Aug. 5, 2020, which is hereby incorporated by reference in its entirety for all purposes. In a different embodiment, however, where no parallel cover assembly system is used, a plunger with a built-in socket cover may be used to push down on the DUTs in the carrier to make contact with the respective sockets.

Embodiments of the present invention eliminate the key disadvantages of the conventional tester systems. The high-parallelism architecture of existing HVM (High-Volume Manufacturing) SLT systems is adapted for high-frequency test applications by incorporating the necessary test equipment, shielding, and high-speed signal paths (cabling, connectors, board traces, etc.). In order to maintain signal fidelity over repeated insertions, the TIBs (Tester Interface Boards) with the sockets and corresponding per-DUT test circuitry remain fixed in the test rack of the system, and are only removed and disconnected for servicing.

With the TIBs remaining fixed in the test rack, embodiments of the present invention use a passive carrier 106 (as shown in FIG. 1A) or test tray to move the DUTs between the pick-and-place assembly and the test rack (or test chamber 104). This maintains a high-parallelism and high UPH (units per hour) without requiring repeated disconnects of the high-frequency signal paths.

In an embodiment, during testing, the entire carrier with multiple DUTs is inserted into a slot in the test rack, and lowered onto the fixed TIB. The DUTs remain in the carrier while per-DUT socket covers in the test rack are applied to provide the necessary force between the DUT and socket to complete the electrical connections. In one embodiment, the socket covers are typically aligned with pogo pins on top of the device or socket to enable the socket covers to form an RF shield in collaboration with the carrier and the socket. As noted above, a parallel cover assembly system may be used to place the socket covers onto the DUTs. In a different embodiment, however, a plunger that has an integrated socket cover may be used to push down on each DUT in the carrier to make contact with the respective socket.

In one embodiment, the DUTs on the carrier tray 106 may be spaced fairly close to each other and need to be shielded, e.g., in the case of RF DUTs. Because of the proximity between the DUTs, there is a high potential of cross-talk between devices. Plus, there is less space to be able to introduce the shielding on a per-socket basis. In one embodiment, therefore, because the carrier stays in place, the carrier structure itself is incorporated into the shielding as well. For high-frequency applications, the socket covers, together with the socket, typically provide the required electrical shielding between DUTs, as well as providing the means for top-side contact as required. In the proposed implementation, since the DUTs remain in the carrier during testing, the carrier needs to be an integral part of the shielding design. To address this issue, a novel "sandwich" approach is used where the socket, carrier, and socket cover combine to form the per-DUT shielding.

Figure 2A:
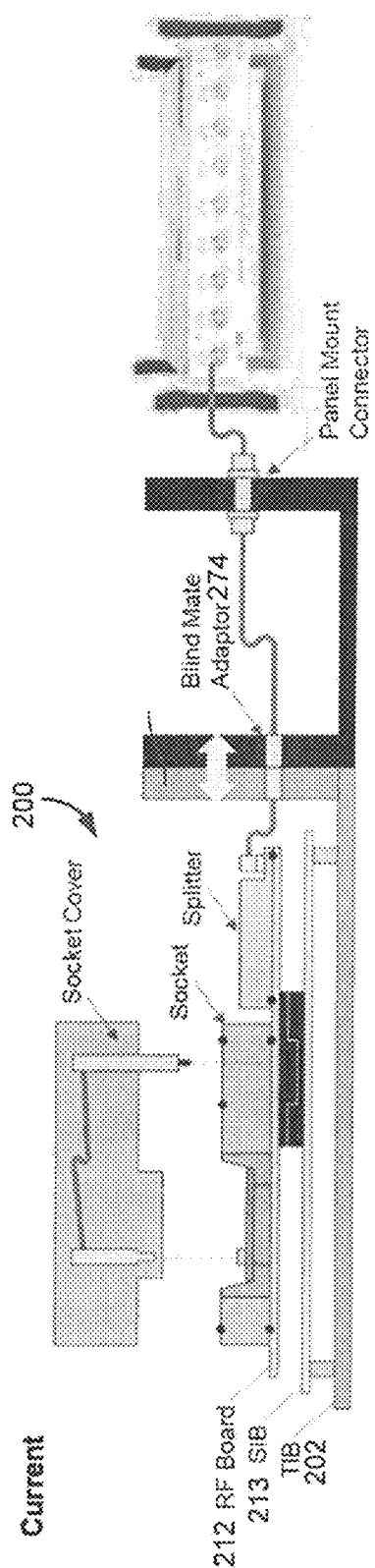
FIG. 2A is an illustration of a TIB placed in a slot of a conventional tester.

FIG. 2A is an illustration of a TIB placed in a slot 200 of a conventional tester. As shown in FIG. 2A, the TIB 202 in conventional testers is configured to slide in and out of the slot each time a new batch of DUTs needs to be loaded. The RF board 212 may be affixed to the SIB 213 which is affixed to the TIB 202. In a conventional tester the entire TIB 202 and all the attached components may need to be disconnected from the tester. The TIB slides out of the slot, new DUTs are loaded and the TIB then slides back into the slot with the new DUTs for further testing. A blind mate adaptor 274 connects the TIB to the tester rack. As shown in FIG. 2A, the entire TIB 202 with the attached RF board 212 slides out and then slides back in with a new batch of DUTs and makes contact with the blind mate adaptor 274 to connect the TIB to the tester rack.

Figure 2B:
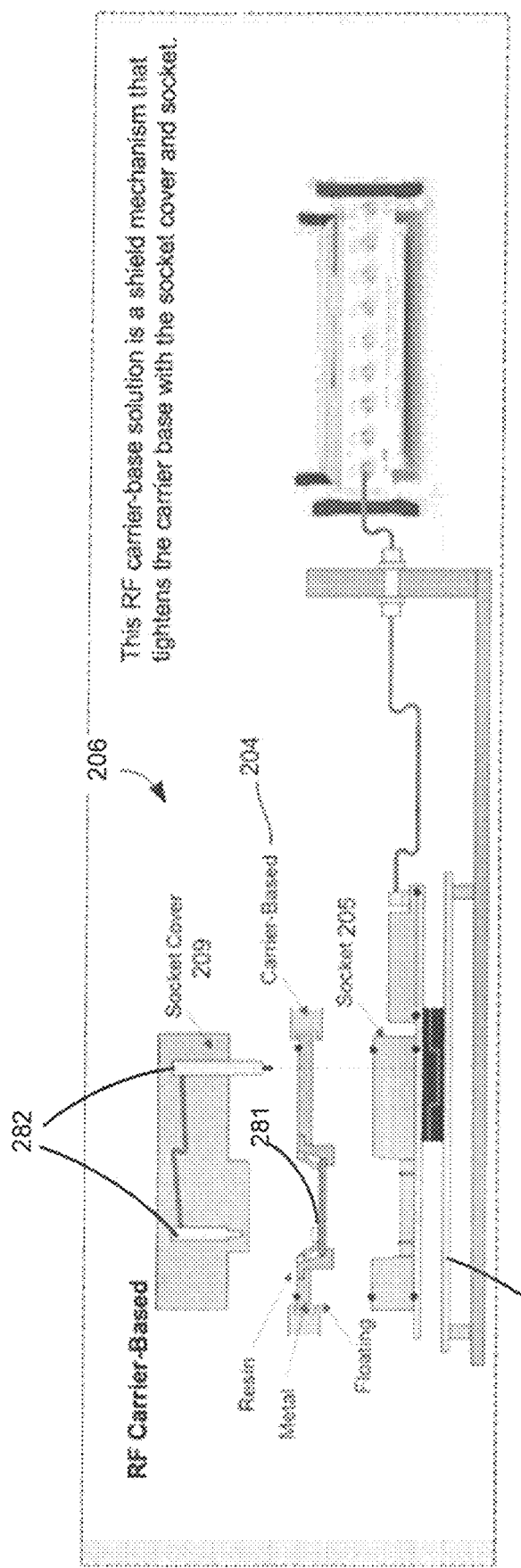
FIG. 2B is an illustration of a TIB that remains fixed in a slot of a tester rack while a passive carrier tray (as discussed above) slides into the slot to move DUTs into the tester rack in accordance with embodiments of the present invention.

FIG. 2B is an illustration of a TIB that remains fixed in a slot 206 of a tester rack while a passive carrier tray 204 (as discussed above) slides into the slot to move DUTs into the tester rack in accordance with embodiments of the present invention. The carrier tray slides in on top of the socket 205 and the socket cover 209 is lowered, using a plunger (not shown) for example, to push the DUT 281 down into the socket to make contact. Note that while FIG. 2B only shows a single socket, the passive carrier is capable of carrying an array of DUTs that are aligned with and lowered onto an array of sockets. Similarly, a socket actuator array can comprise an array of socket covers (e.g., socket cover 209) that correspond to the array of DUTs and the array of sockets on the TIB. In one embodiment, a parallel cover assembly system may be used to position the socket covers onto the DUTs before the socket actuator array pushes the socket covers onto the DUTs. In a different embodiment, the socket actuator array may comprise plungers with integrated socket covers that are used to actuate the DUTs.

In one embodiment, the carrier tray 204 is sandwiched between the socket covers and the TIB comprising the sockets. The socket covers (which may be part of an actuator array) pushes the DUTs down into the sockets. The DUTs on the carrier are situated in respective pockets of the carrier on a thin membrane. The DUTs rest on the membrane and get pushed into the socket. The bottom of the DUTs comprises a ball-grid array where the solder balls of the ball-grid array get pushed through the membrane to make contact with the socket. In one embodiment, the socket covers will typically be aligned with pogo pins 282 on top of the device or socket to enable a socket cover 209 in the socket cover array to form an RF shield in collaboration with the carrier 204 and the respective socket 205. After the DUTs are done testing, the actuator array rises back up and the carrier slides back out of the slot with the DUTs on it. In the tester therefore, all the TIBs are able to remain in the slot while the carriers are moved in and out of the various slots during testing.

As mentioned above, socket covers (e.g., socket cover 209) in the test rack are applied to provide the necessary force between the DUT and socket to complete the electrical connections. For high-frequency applications, these covers 209, together with the socket 205 and the carrier 204, typically provide the required electrical shielding between DUTs, as well as providing the means for top-side contact as required. Embodiments of the present invention sandwich the carrier 204 between the socket cover 209 and the socket 205 to provide per-DUT shielding. The socket cover 209, the carrier 204 and the socket 205 together create the RF shield. Note that each carrier (e.g., carrier 204) comprises an array of DUTs on it (e.g., an x-y matrix of DUTs). The carrier is pushed onto a TIB 284 that has the sockets (e.g., socket 205) on it. There is also an array of socket covers (e.g., socket cover 209) above the carrier that are pushed onto the carrier and the sockets so that the socket cover, the carrier and the socket together form an RF shield. Each combination of a socket, the carrier and a socket cover creates a separate RF shield that isolates the respective enclosed DUT from other DUTs on the carrier.

Figure 2C:
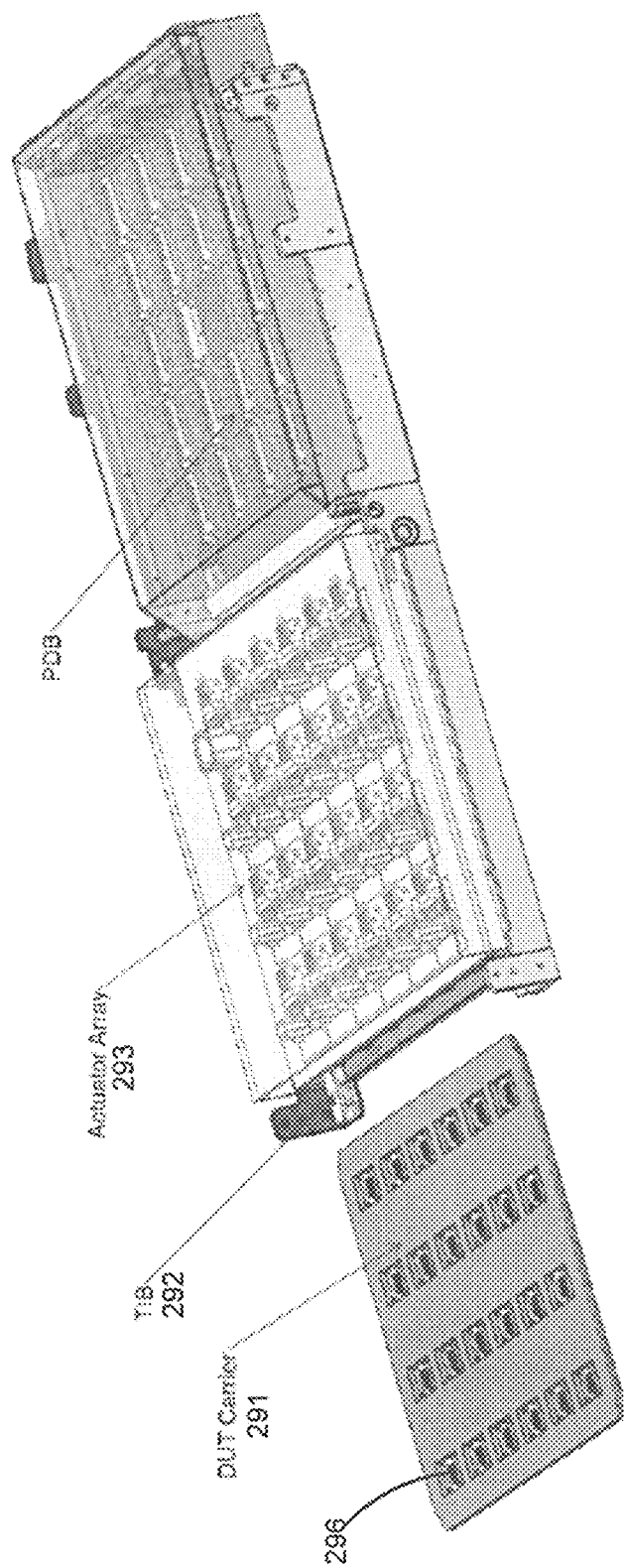
FIG. 2C provides a top view of the manner in which a carrier slides into a slot in accordance with an embodiment of the present invention.

FIG. 2C provides a top view of the manner in which a carrier slides into a slot in accordance with an embodiment of the present invention. As shown in FIG. 2C, the DUT carrier 291 comprises an array of DUTs 296. The DUT carrier 291 slides into the slot so that the DUTs on the carrier tray are aligned with the sockets disposed on TIB 292. The actuator array 293 is then used to actuate the DUTs onto the sockets as discussed above.

Figures 3A, 3B:
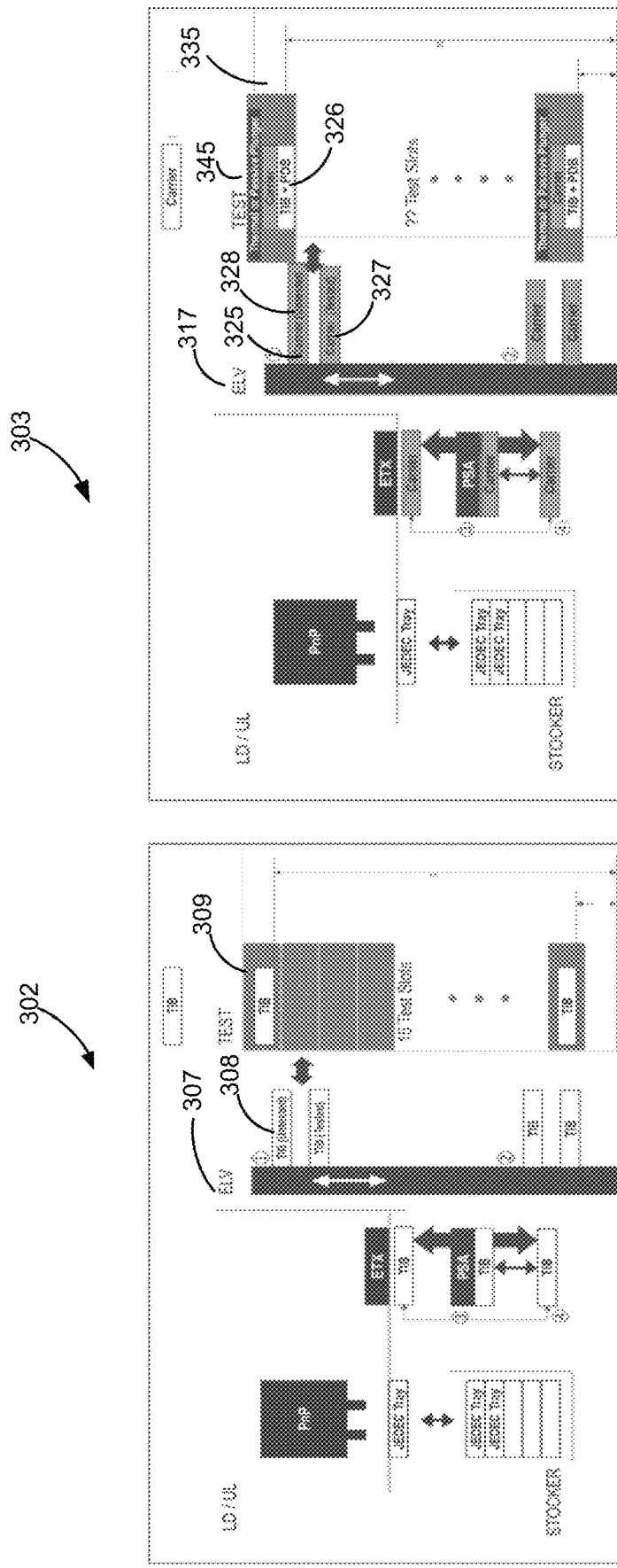
FIG. 3A illustrates a side-view of a conventional tester 302.
FIG. 3B illustrates a side-view of a tester that allows the TIB to remain fixed in the slot while the carriers are moved in and out of the slot in accordance with embodiments of the present invention.

FIG. 3A illustrates a side-view of a conventional tester 302. As shown in FIG. 3A, in the conventional testers, the elevator 307 moves the TIBs vertically and slides the TIBs 308 (along with the socket and test circuitry) into the test slots into the tester rack 309. Conventional testers move the TIBs between the pick and place assembly and the elevator and, finally, the test rack (with the slots). In conventional testers, such as the one shown in FIG. 3A, the TIB needs to be regularly removed in and out of the slot, which is problematic for reasonable explained above.

FIG. 3B illustrates a side-view of a tester 303 that allows the TIB to remain fixed in the slot while the carriers are moved in and out of the slot in accordance with embodiments of the present invention. In one embodiment, a carrier 325 comprising the DUTs is vertically displaced by elevator 317 and slid into a slot in the tester rack 335. The TIB 326 and the power distribution board (PDB) stay in place within the rack 335. A plunger 345 can push the DUTs on the carrier into the sockets. The passive carrier 325 is typically the moving component that moves in and out of the rack 335 while the remaining components, e.g., the TIB, PDB and plunger stay within the rack. In one embodiment, multiple carriers are employed in a tester system to transport DUTs in an out of the vertical slots of the tester rack associated with the tester 303.

In one embodiment, dual elevators (or "dual-slot elevators") are used, e.g., elevator 114 in FIG. 1 or elevator 317 in FIG. 3B may be dual-slot elevators. A dual-slot elevator has two slots arranged vertically, e.g., slots 327 and 328 in FIG. 3B. One elevator slot is used to bring the carrier with DUTs from the pick-and-place (PnP) to the test slot. But since there is usually already a pre-existing carrier in the test slot that needs to be removed after testing, the other elevator slot is used to remove that carrier from the test slot before inserting the new carrier from the PnP. Once the operation is complete, it takes the tested carrier that it just removed back to the PnP for unloading and loading. This eliminates any need of the elevator assembly having to make two trips back and forth.

In one embodiment, the dual-slot elevator operates as follows: a) transport a carrier with untested DUTs from the loader/unloader to the test slot, using one of the two elevator slots; b) remove the carrier with tested DUTs from the test slot, by loading it into the other (empty) elevator slot; c) move vertically to line up the carrier with nested DUTs with the same test slot the carrier with tested DUTs was just unloaded from, and load the carrier with untested DUTs into that test slot; and d) transport the carrier with tested DUTs back to the loader/unloader.

In one embodiment, buffer carriers present in the system allow pipelining of multiple carriers. Buffer carriers are additional carriers that can be loaded with DUTs even when all test slots are filled with carriers whose DUTs are currently being tested. For example, slots 327 and 328 may, in one embodiment, be also able to transport buffer carriers. Using buffer carriers speeds up overall system throughput, as the loaded buffer carriers are queued up for immediate swapping into test slots as soon as the previous test cycle has completed. Without the buffer carriers, test slots would be idle while the carrier is cycled back to the PnP for unloading/loading, then back to the test slot. Note that this is different than buffer TIBs or burn in boards or load boards which actually have expensive sockets and circuitry and hence involve a careful tradeoff of buffer TIB costs v/s UPH improvements. In this case, buffer carriers are purely mechanical and do not involve socket cost and hence as many buffer carriers as needed can be added. In one embodiment, the elevator architecture shown in FIG. 1 may need to be changed from a forward and reverse architecture to a pipelined architecture to support more than one buffer carrier per elevator assembly.

Figure 4:
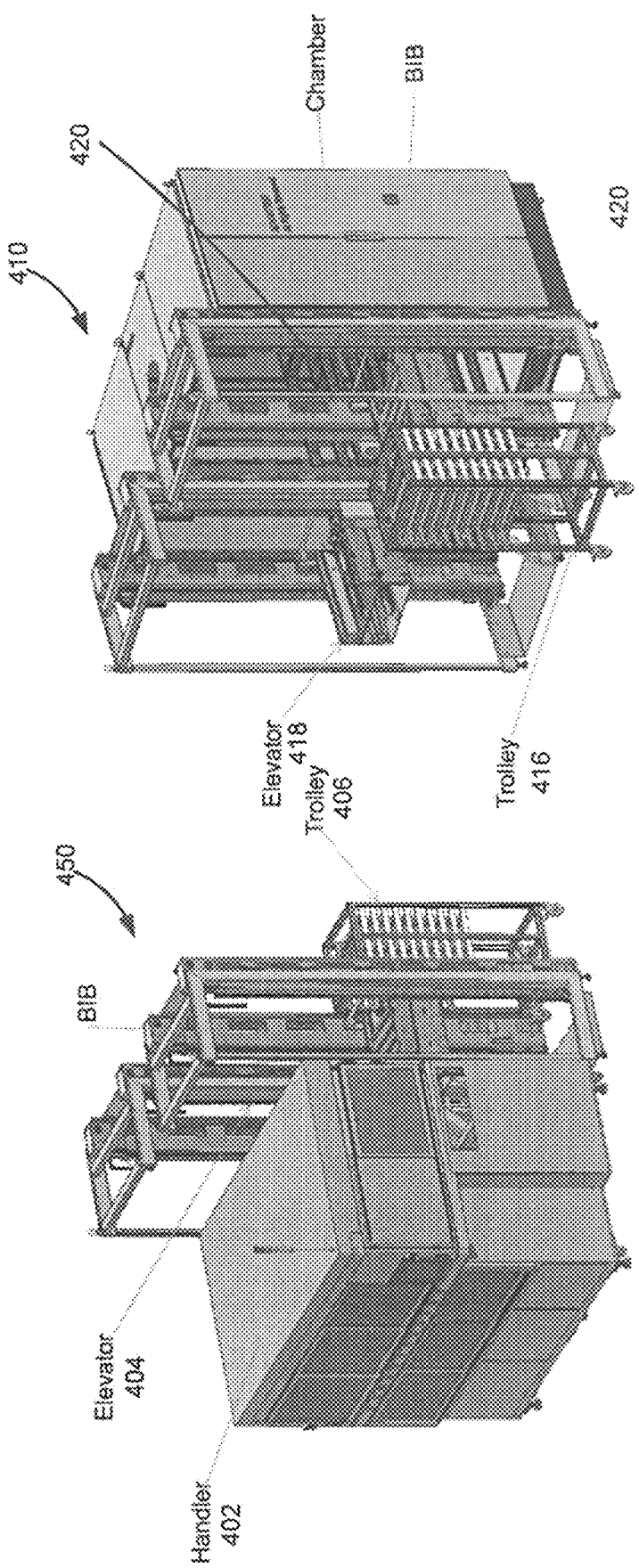
FIG. 4 illustrates an alternate slot-based system in accordance with embodiments of the present invention.

FIG. 4 illustrates an alternate slot-based system in accordance with embodiments of the present invention. An alternate slot-based system comprises a semi-automated system with a handler 402, elevator 404 and trolley 406 combination as a centralized loading/unloading pick-and-place (PnP) station that services multiple testing stations (e.g., station 410) comprised of trolley 416, elevator 418 and slot 420 combinations. Operators or robots are used to move the trolleys of loaded carriers between the centralized PnP station 450 and the test stations (e.g., test station 410). This is used when test times are long, allowing a single PnP to service more than 1-2 test racks with minimal impact on test throughput. In this case, the optimal UPH definitely requires the use of buffer BIBS, TIBs, or carriers, as well as buffer trolleys, to maximize UPH. Using carriers (with no sockets/electronics) as opposed to BIBs/TIBs with sockets is a definite advantage for this scenario due to the significantly lower cost of the carriers.

Figure 5:
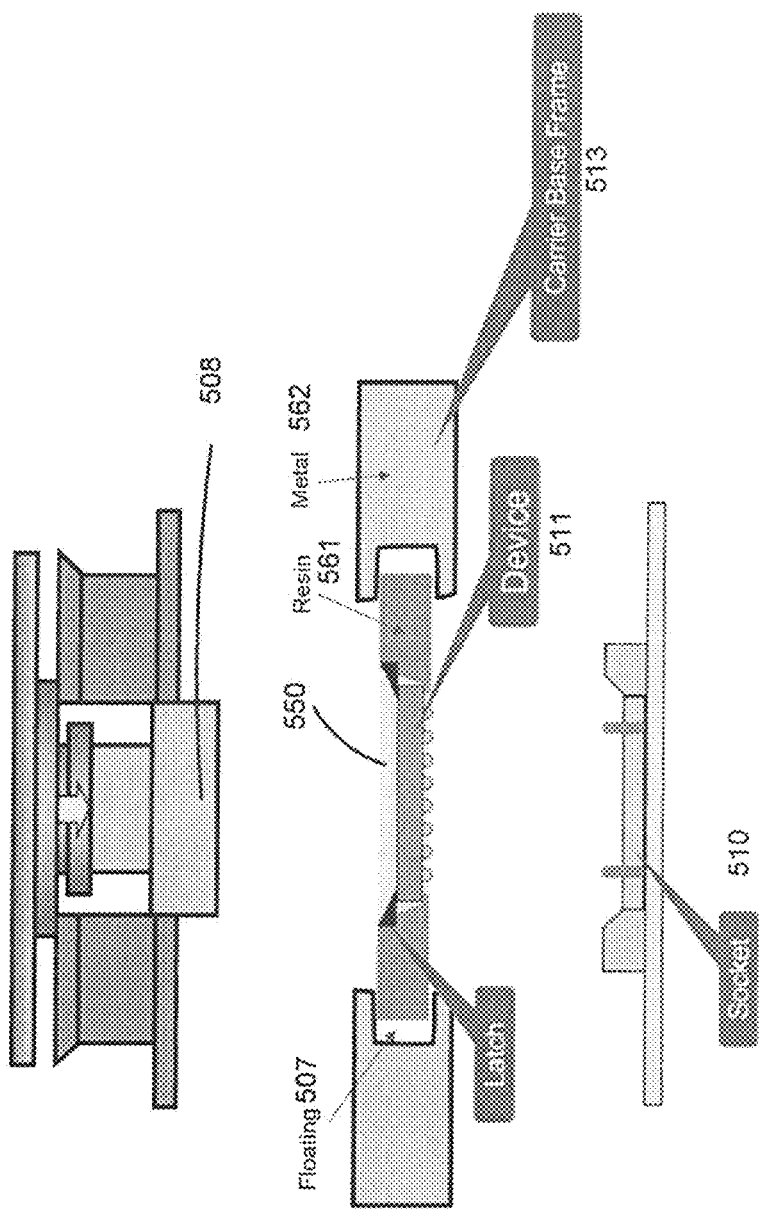
FIG. 5 illustrates the manner in which the socket, the carrier, and the socket cover combine to form the per-DUT shielding in accordance with embodiments of the present invention.

FIG. 5 illustrates the manner in which the socket, the carrier, and the socket cover combine to form the per-DUT shielding in accordance with embodiments of the present invention. In one embodiment, the DUT 511 is latched into place in a floating configuration 507 within the carrier base frame 513. The carrier base frame 513 holds the individual floating per DUT carrier elements. That carrier base frame 513 comprises a metal component 562 and a resin component 561, which holds the DUT 511 in place. The floating configuration ensures compliance in the x, y, and z direction. The DUTs on the carrier are situated in respective pockets of the carrier on a thin membrane 550.

The embodiment of FIG. 5 may comprise a plunger 508 with an integrated socket cover. The DUTs (e.g., device 511) rest on the membrane and the solder balls of the DUTs push through the membrane 550 and make contact with the socket 510 when the plunger 508 pushes down on the DUT 511. In other words, the plunger 508 pushes the DUT 511 into the socket 510 and applies force, so that the solder balls make electrical contact with the socket 510.

In one embodiment, the per-DUT RF shields are formed though the novel combination of a plurality of socket covers, a carrier containing a plurality of floating per-DUT carrier elements, and a plurality of sockets. The floating design of the per-DUT carrier elements provides both mechanical compliance to compensate for tolerance variations across the full structures of the TIBs that are housed in the test slots, as well as electrical isolation between the per-DUT carrier elements. After the carrier is inserted into the test slot, the socket covers are actuated, resulting in the compression of the per-DUT cover, carrier element, and socket. A flange or similar mechanically compliant and electrically conductive means is used on the top and bottom of the carrier elements to provide hermetic seals between the layers of each sandwich of the per-DUT cover, carrier element, and socket. The socket covers and sockets have already been designed to provide electrical shielding on the top and bottom, respectively, so the hermetically sealed sandwich provides the required per-DUT electrical isolation.

Note that embodiments of the present invention use a per-DUT force cancellation approach where the force of each plunger mechanism is canceled directly with its accompanying socket. In classical memory handlers, the sockets are mounted directly on an extremely rigid substrate. While there are typically individual plungers that provide the force that ensures proper contact between the DUT and socket, this force is not canceled on a per-DUT basis, but instead the full force of all the plungers is canceled at the level of the entire multi-DUT socket substrate with the entire multi-plunger assembly. This has multiple drawbacks for a high volume system level test system. In order to provide the necessary test circuitry that accompanies each socket on the TIB, a daughter card architecture is often required where circuitry is stacked on multiple cards that are typically fairly thin (where each daughter card stack may, e.g., support one socket). If force is canceled at the level of the entire substrate structure instead of on a per-socket basis, these boards would not be able to withstand the significant compression force required to ensure proper contact. Also for a large TIB with many sockets, even small tolerance variations across the TIB can make it difficult to control the forces uniformly across the entire structure when canceling forces at the level of the entire structure.

In order to address these issues, embodiments of the present invention use a per-DUT force cancellation approach where the force of each plunger mechanism (or actuator mechanism) is canceled directly with its accompanying socket. For example, the plunger 508 can be outfitted with a mechanism that latches onto wings that are built into the socket. Note that when designing the carrier structure, the need to reach through the carrier at each DUT location to access (e.g., grab) the socket needs to be addressed.

Figure 6:
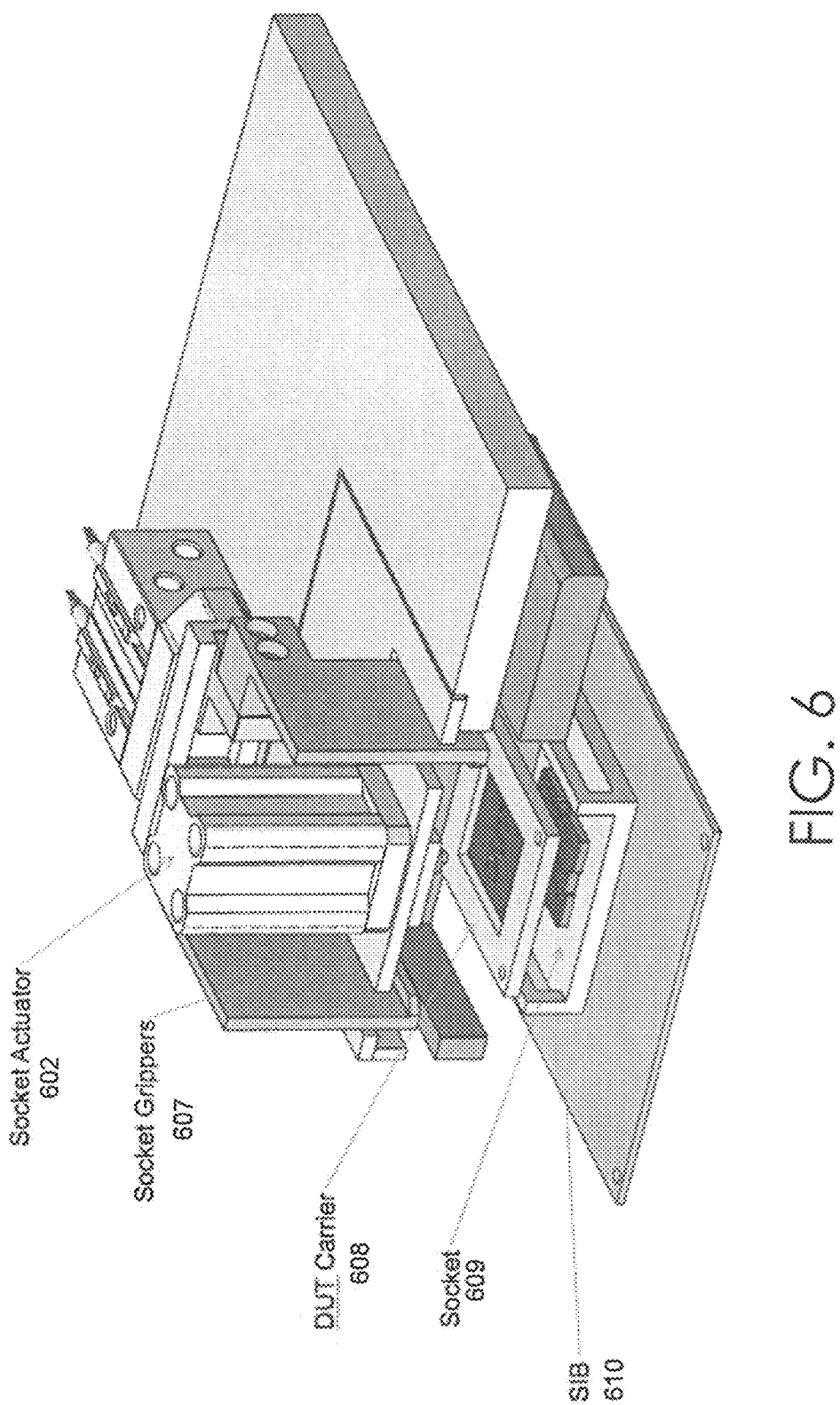
FIG. 6 illustrates a single site exploded view of a DUT in a carrier where socket grippers are used for local force cancellation in accordance with embodiments of the present invention.

FIG. 6 illustrates a single site exploded view of a DUT in a carrier where socket grippers are used for local force cancellation in accordance with embodiments of the present invention. As shown the DUT carrier 608 contains the DUT that is brought into connection with a socket 609 affixed to SIB 610 using a socket actuator 602. The socket actuator 602 in conjunction with the socket grippers 607 provides per-DUT force cancellation.

Carrier Based High Volume System Level Testing of Devices with POP Structures

As mentioned above, along with the need for a slot-based architecture, there is a need to provide integrated device manufacturers, fabless semiconductor manufacturers and outsourced semiconductor assembly and test companies engaged in the high-volume manufacturing and testing of devices, a way to be able to use POP (package on package) structures during system level tests of their devices. For example, a customer manufacturing application processors will need to temporarily add memory, e.g., in a POP structure to the application processors during system level tests of the processors. For testing purposes, customers need a convenient way to temporarily position the memory adjacent to the processors, typically in a stacked configuration. Accordingly, a need exists for a slot-based architecture that can use POP structures to be able to perform system level tests of the devices.

Embodiments of the present invention provide a slot-based architecture that uses POP structures to perform system level tests on devices where a memory chip can be positioned adjacent to an application processor during testing. In one embodiment, the slot-based tester system comprises: a) a tester (including power delivery board and controls); b) a tester board such as ATE load-board or Test Interface Board (TIB) with Socket Interface Board (SIB) or Burn-In Board (BIB); c) an open socket to hold one or more DUTs (Device Under Test); d) a passive carrier/test tray that holds multiple DUTs (note that multiple carriers or test trays may be present in the system); e) an optional parallel cover assembly system (PCA) to place POP memory nests on top of the DUTs in the carrier (where each DUT receives its own POP memory nest); f) a handler and movement system similar to a memory test handler that places DUTs into carriers and further places the DUTs within the carriers on top of the sockets, where the socket contains alignment features to guide the POP memory nest into the socket (e.g., typically there is a gross alignment pin and a fine alignment pin); and g) plungers to push down the socket covers (with optional POP memory nests) and DUTs into the sockets.

A POP memory nest comprises a structure that enables temporary electrical contact of a memory chip with a DUT (Device Under Test) in a vertically stacked POP (Package-on-Package) configuration. The structure may also provide a thermal conductivity path from a thermal head through the memory to the DUT. The POP memory nest is typically composed of a memory chip, an interposer layer that provides electrical conductivity between the contacts on the memory chip and the DUT while protecting the memory chip from damage during repeated contacting cycles, and a frame structure that houses the memory chip and interposer layer and has features for precise alignment with the socket containing the DUT during testing. While the structure typically interfaces a memory device with a processor device, it may also be a different nest that has an RF device stacked on top of a digital device.

In one embodiment, a parallel socket cover assembly system, similar to the one described above, may be used to place POP memory nests on top of the DUTs in the carrier (where each DUT receives its own POP memory nest). Thereafter, a plunger may be used to actuate the memory nests and the associated DUTs. Actuating the pop memory nests and the DUTs means to apply contact force on top of the memory nests and the DUTs to push them down to make electrical contact with the socket electronics. The parallel cover assembly system may be similar to the one described in U.S. patent application Ser. No. 16/986,037, entitled, "Integrated Test Cell Using Active Thermal Interposer (ATI) with Parallel Socket Actuation," filed in Aug. 5, 2020, which is hereby incorporated by reference in its entirety for all purposes. In a different embodiment, however, where no parallel cover assembly system is used, a plunger with an integrated socket cover and POP memory may be used to push down on the DUTs in the carrier to make contact with the respective sockets.

In one embodiment, an array of memory nests or POP devices is aligned on top of the TIB boards with alignment features for sockets. For example, the parallel cover assembly system (PCA) may place POP memory nests on top of the DUTs in the carrier (where each DUI receives its own POP memory nest). In one embodiment, the POP memory nests may be comprised within a POP array that includes floating nests that can adjust in the XY direction in order to align individually with respective pads found on the DUTs. The floating nests may also include a mechanically fixed PCB that is fixed to the respective POP memory nest and can either mate to a memory contactor array that can accept an unattached POP device such as a memory or can include an attached memory in order to accommodate different POP requirements. In a method, the POP array including a number of floating nests with memory loaded is aligned and presented to the corresponding DUTs just prior to testing the combined DUT and POP memory assemblies. An application processor that needs to be tested will typically have pads on top where a memory chip can make contact. A customer will typically need to perform a system level test of a processor (e.g., a DUT in the socket) along with the memory (e.g. a memory chip inside the POP structure).

Embodiments of the present invention allow a processor DUT to be tested in conjunction with the memory which is placed inside the POP structure or nest disposed on top of the DUT. It should be noted that the POP structures do not necessarily only contain memory chips and can be customized to include different types of devices based on a customer's requirements. For example, other types of devices that may be placed inside the POP structure include another processor, a RF device, etc. The POP structure may, for example, be used to stack any two types of devices on top of each other, e.g., an RF device stacked on top of digital device, a memory device stacked on top of processor or even a processor stacked on top of a memory device.

Figure 7:
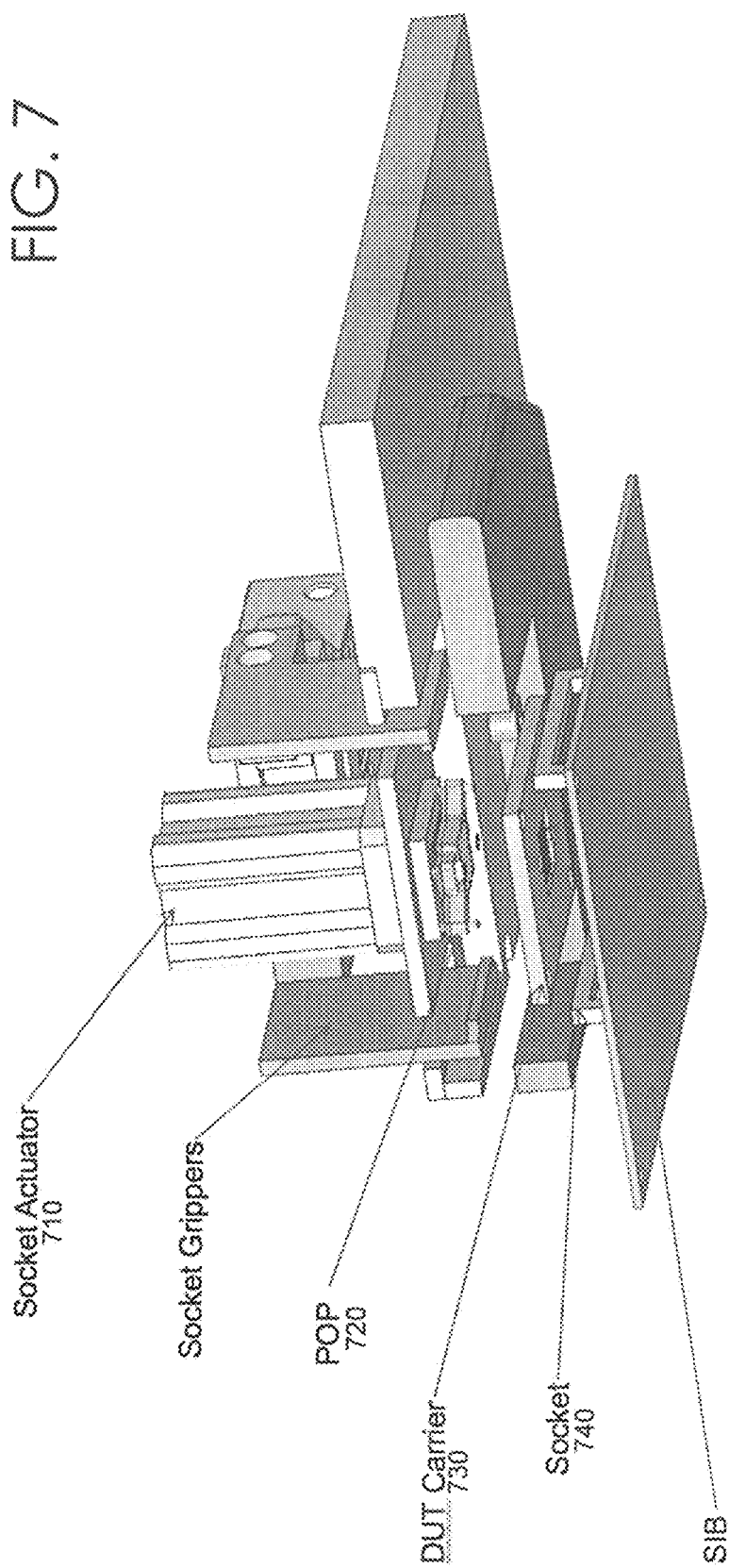
FIG. 7 illustrates a single test site where a POP nest is aligned on top of the DUT carrier in accordance with embodiments of the present invention.
Figure 8:
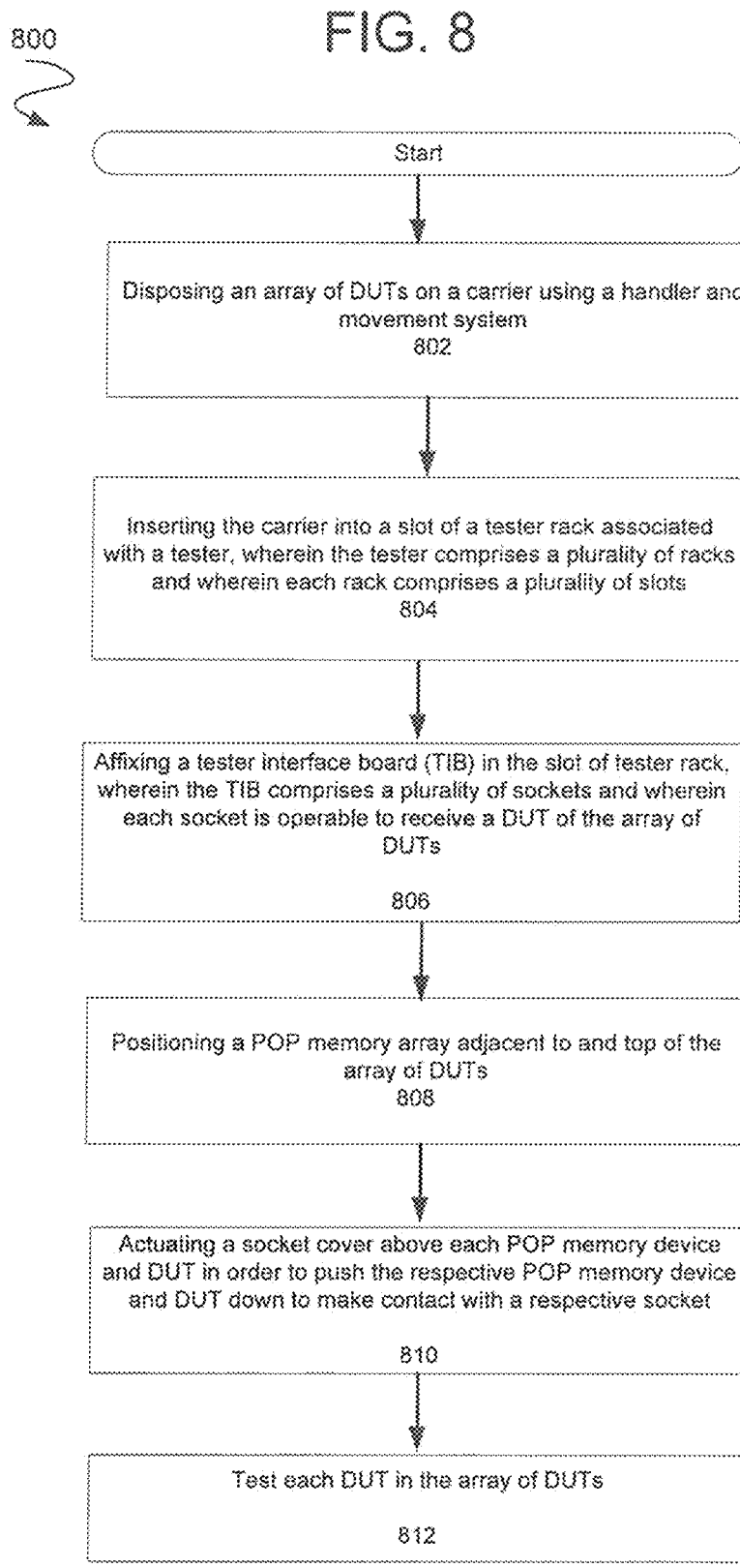
FIG. 8 depicts a flowchart of an exemplary process of testing DUTs according to an embodiment of the present invention.

FIG. 7 illustrates a single test site where a POP nest is aligned on top of the DUT carrier in accordance with embodiments of the present invention. As shown in FIG. 7, a socket actuator 710 (which may be part of the PCA system) actuates a POP structure 720 on top of a DUT in the DUT carrier 730. A handler and movement system (not shown) places the DUT into the carrier 730 and further places the DUT within the carrier 730 into the socket 740, where the socket 740 contains alignment features to guide the POP memory nest 720 into the socket FIG. 8 depicts a flowchart of an exemplary process of testing DUTs according to an embodiment of the present invention. The embodiments of the invention, however, are not limited to the description provided by flowchart 600. Rather, it will be apparent to persons skilled in the relevant art(s) from the teachings provided herein that other functional flows are within the scope and spirit of the present invention.

At block 802, an array of DUTs is disposed on a carrier using a handler and movement system.

At block 804, the carrier is inserted into a slot of a tester rack associated with a tester, wherein the tester comprises a plurality of racks, and wherein each rack comprises a plurality of slots. In one embodiment, the slots are stacked vertically. In a different embodiment, the slots may also be arranged horizontally.

At block 806, a tester interface board (TIB) is affixed in the slot of the tester rack. In one embodiment, the TIB comprises a plurality of sockets, wherein each socket is operable to receive a device under test (DUT), and wherein each DUT in the array of DUTs aligns with a respective socket on the tester interface board.

At block 808, a POP memory array comprising an array of POP memory nests or POP memory devices is positioned adjacent to the array of DUTs so that each POP memory device or nest in the array is positioned on top of and adjacent to a respective DUT. In one embodiment, each POP memory device is positioned on top of each respective DUT using a parallel cover assembly system.

At block 810, a socket cover above each POP memory device and respective DUT is actuated in order to push the respective DUT down to make contact with a respective socket.

At step 812, each DUT in the array of DUTs is tested.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method of testing devices under test (DUTs), the method comprising:
   loading an array of DUTs on a carrier comprising a plurality of membrane pockets operable to hold the array of DUTs;
   moving the carrier to a slot of a rack associated with a tester using an elevator, wherein the tester comprises a plurality of racks, wherein each rack of the plurality of racks comprises a plurality of slots;
   inserting the carrier into the slot of the rack;
   affixing an interface board in the slot of the rack, wherein the interface board comprises a plurality of sockets, and wherein each socket of the plurality of sockets is operable to receive a respective device under test (DUT), and wherein each DUT in the array of DUTs aligns with a respective socket of the plurality of sockets on the interface board;
   positioning a package-on-package (POP) memory array adjacent to the array of DUTs, wherein the POP memory array comprises an array of memory devices, wherein each memory device of the array of memory devices corresponds to a DUT in the array of DUTs; and
   actuating a socket cover of a plurality of socket covers onto each respective memory device in the POP memory array and a corresponding DUT to push through a corresponding membrane pocket, to make physical and electrical contact with each respective socket of the plurality of sockets.

2. The method of claim 1, wherein each DUT of the array of DUTs comprises pads disposed on a top surface thereof and operable to make contact with a respective POP memory device.

3. The method of claim 1, wherein said positioning comprises placing the array of memory devices into position using a parallel cover assembly system.

4. The method of claim 1, wherein the elevator comprises a dual-slot elevator comprising first and second slots, wherein the first slot is operable to transport the carrier to the slot of the rack, and wherein the second slot is operable to transport a different carrier previously loaded into the slot of the rack.

5. The method of claim 1, wherein the actuating is performed by a plurality of plungers, and wherein the plurality of socket covers and the POP memory array are integrated within the plurality of plungers.

6. The method of claim 1 wherein said loading is performed using a handler and transport system.

7. The method of claim 1 further comprising testing said array of DUTs and said array of memory devices, in combination, using said tester.

8. A method of testing devices under test (DUTs), the method comprising:
- disposing an array of DUTs on a carrier using a handler and transport system, wherein the carrier comprises a plurality of membrane pockets operable to hold the array of DUTs;
- transporting the carrier to a slot of a rack associated with a tester using an elevator, wherein the tester comprises a plurality of racks and wherein each rack of the plurality of racks comprises a plurality of slots;
- inserting the carrier into the slot of the rack;
- placing an interface board in the slot of the rack, wherein the interface board comprises a plurality of sockets, and wherein each socket of the plurality of sockets is operable to receive a respective device under test (DUT), and wherein each DUT in the array of DUTs aligns with a respective socket of the plurality of sockets on the interface board;
- positioning a memory array adjacent to the array of DUTs, wherein the memory array comprises an array of memory devices, wherein each memory device of the array of memory devices corresponds to a DUT in the array of DUTs; and
- actuating a socket cover of a plurality of socket covers onto each respective memory device in the memory array and a corresponding DUT to push through a corresponding membrane pocket, to make physical and electrical contact with each respective socket of the plurality of sockets.

9. The method of claim 8, wherein each DUT of the array of DUTs comprises pads disposed on a top surface thereof and operable to make contact with a respective memory device.

10. The method of claim 8, wherein said positioning comprises placing the array of memory devices into position using a parallel cover assembly system.

11. The method of claim 8, wherein the elevator comprises a dual-slot elevator comprising first and second slots, wherein the first slot is operable to transport the carrier to the slot of the rack, and wherein the second slot is operable to transport a different carrier previously loaded into the slot of the rack.

12. The method of claim 8, wherein the actuating is performed by a plurality of plungers, and wherein the plurality of socket covers and the memory array are integrated within the plurality of plungers.

13. The method of claim 8 further comprising testing said array of DUTs and said array of memory devices, in combination, using said tester.

14. A method of testing devices under test (DUTs), the method comprising:
- loading an array of DUTs on a carrier comprising a plurality of membrane pockets operable to hold the array of DUTs;
- moving the carrier to a slot of a rack associated with a tester system, wherein the tester system comprises a plurality of racks, wherein each rack of the plurality of racks comprises a plurality of slots;
- inserting the carrier into the slot of the rack;
- affixing an interface board in the slot of the rack, wherein the interface board comprises a plurality of sockets, and wherein each socket of the plurality of sockets is operable to receive a respective device under test (DUT), and wherein each DUT in the array of DUTs aligns with a respective socket of the plurality of sockets on the interface board;
- positioning a package-on-package (POP) memory array adjacent to the array of DUTs, wherein the POP memory array comprises an array of memory devices, wherein each memory device of the array of memory devices corresponds to a DUT in the array of DUTs;
- actuating a socket cover of a plurality of socket covers onto each respective memory device in the POP memory array and a corresponding DUT to push through a corresponding membrane pocket, to make physical and electrical contact with each respective socket of the plurality of sockets; and
- testing said array of DUTs and said array of memory devices, in combination, using said tester system.

15. The method of claim 14, wherein each DUT of the array of DUTs comprises pads disposed on a top surface thereof and operable to make contact with a respective POP memory device.

16. The method of claim 14, wherein said positioning comprises placing the array of memory devices into position using a parallel cover assembly system.

17. The method of claim 14, wherein the moving is performing using an elevator and wherein the elevator comprises a dual-slot elevator comprising first and second slots, wherein the first slot is operable to transport the carrier to the slot of the rack, and wherein the second slot is operable to transport a different carrier previously loaded into the slot of the rack.

18. The method of claim 14, wherein the actuating is performed by a plurality of plungers, and wherein the plurality of socket covers and the POP memory array are integrated within the plurality of plungers.

19. The method of claim 14, wherein said loading is performed using a handler and transport system.

20. The method of claim 14 wherein said actuating comprises applying contact force on top of the array of DUTs for pushing them down to make electrical contact with electronics of the plurality of sockets.

* * * * *